United States Patent [19]

Kronberg

[11] Patent Number: 5,424,731
[45] Date of Patent: Jun. 13, 1995

[54] REMOTE TWO-WIRE DATA ENTRY METHOD AND DEVICE

[75] Inventor: James W. Kronberg, Aiken, S.C.

[73] Assignee: The United States of America as represented by the United States Department of Energy, Washington, D.C.

[21] Appl. No.: 720,128

[22] Filed: Jun. 24, 1991

[51] Int. Cl.[6] .......................................... H03M 11/00
[52] U.S. Cl. .......................................... 341/26; 341/22
[58] Field of Search ...................... 341/26, 20, 34, 22, 341/825.79; 178/18; 340/825.79, 711, 706; 345/168, 174

[56] References Cited

U.S. PATENT DOCUMENTS

| | | | |
|---|---|---|---|
| 3,633,180 | 1/1972 | Pabst | 341/20 |
| 4,502,040 | 2/1985 | Castel | 341/22 |
| 4,725,816 | 2/1988 | Petterson | 341/26 |
| 5,014,051 | 5/1991 | Lippmann et al. | 340/870.38 |

Primary Examiner—John K. Peng
Assistant Examiner—A. Hill
Attorney, Agent, or Firm—Brian R. Tumm; Harold M. Dixon; William R. Moser

[57] ABSTRACT

A device for detecting switch closure such as in a keypad for entering data comprising a matrix of conductor pairs and switches, each pair of conductors shorted by the pressing of a particular switch, and current-regulating devices on each conductor for limiting current in one direction and passing it without limit in the other direction. The device is driven by alternating current. The ends of the conductors in a conductor pair limit current of opposing polarities with respect to each other so that the signal on a shorted pair is an alternating current signal with a unique combination of a positive and a negative peak, which, when analyzed, allows the determination of which key was pressed. The binary identification of the pressed key is passed to the input port of a host device.

11 Claims, 2 Drawing Sheets

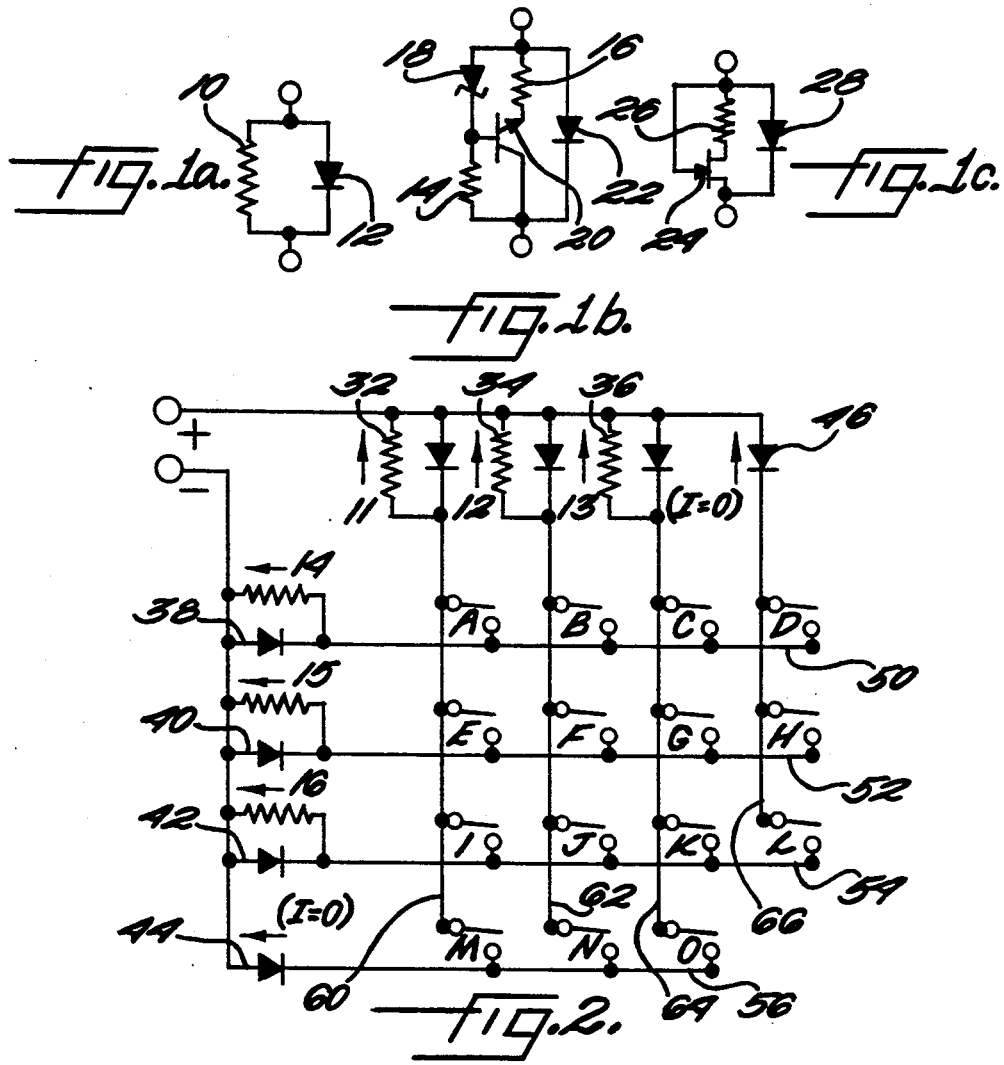
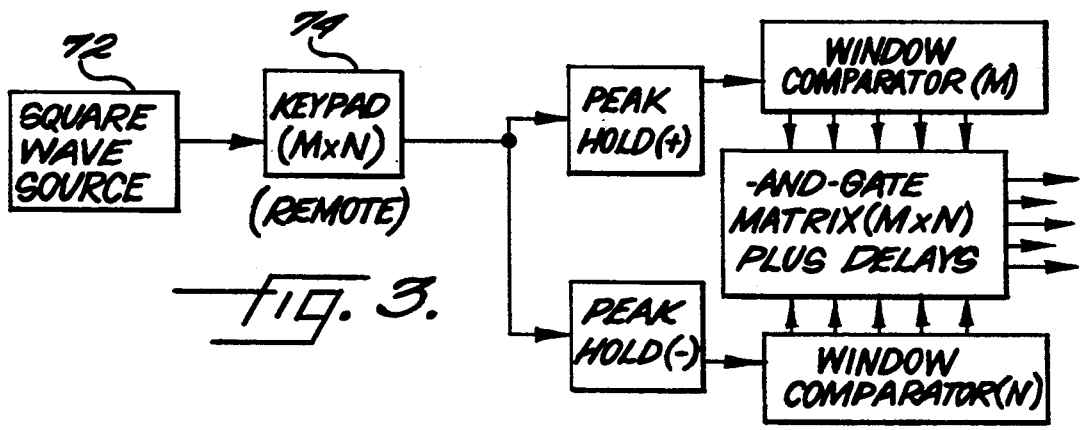
Fig. 1a. Fig. 1b. Fig. 1c.
Fig. 2.
Fig. 3.

REMOTE TWO-WIRE DATA ENTRY METHOD AND DEVICE

BACKGROUND OF THE INVENTION

1. Field of the Invention

The present invention relates to devices and methods for electronic data entry. More particularly, the present invention relates to a device and method for remotely detecting the closure of a switch in a matrix of switches, as in a keypad, for data entry. The United States Government has rights in this invention pursuant to Contract No. DE-AC09-89SR18035 between the U.S. Department of Energy and Westinghouse Savannah River Company.

2. Discussion of Background

A keypad, keyboard or other switch array for data entry to a host device typically takes one of four forms. Each of these forms has its own advantages and limitations.

Electronically simple, matrix keypads consist of multiple keys or other switches placed at the crossings of two parallel groups of conductors, which represent "rows" and "columns" of keys. When a switch is closed, it connects one row wire to one column wire. In a matrix keypad, all wires run separately to the host device. For large numbers of keys, or with significant distance between keypad and host, the number of wires running to the host device can require a large, expensive and cumbersome connecting cable.

A more sophisticated keypad uses various encoding schemes to send data back, for instance, by using active electronic circuitry to convert switch closures to ASCII equivalents for transmission to the host over a serial line. Such a keypad needs fewer connecting wires (typically four) than an unencoded matrix, but the fact that it contains active electronic components gives it three liabilities: it is more expensive than the simple matrix type, it requires a power source to drive the active components, and it is restricted to use in environments where these devices function can function reliably. Wet, very hot, very cold, or electrically noisy environments can place severe limitations on a keypad of this type.

Still more sophisticated is a wireless keypad, which requires no direct connection to the host but transmits data, for example, over a beam of infrared light. While offering great convenience, such a keypad has most of the liabilities of the encoded type, plus two others: it must contain batteries, solar cells, or some other independent power source, and it can be used only when there is a clear transmission path back to the host. It is, however, virtually immune to electrical noise. Wireless keypads are quite expensive and chiefly limited to "clean" environments such as the office or home.

All of the keypad types described above are "digital" in that they use signals or connections which are either "on" or "off". There is a fourth type of keypad, little-used at present, but quite inexpensive and requiring only a two-wire link back to the host. This fourth type transmits data by a variable analog current. Resistors or other current-limiting devices are connected through normally-open pushbutton switches between wires forming a current loop. With all switches open, the current in the loop is practically zero. Pressing each of the buttons allows a different level of current to flow. By measuring this current, comparator and gating circuitry in the host can determine which key was pressed. While analog current-loop transmission is inherently immune to most electrical noise, the available precision in analog circuitry (weighed against cost) normally limits the usefulness of this type of keypad to about eight or ten different keys and current levels.

Keypads and switch arrays have been the subject of several patents. Several of these use voltage divider networks to identify each switch by a different voltage level. See Ohtsuka, et al. (U.S. Pat. No. 4,872,008), Crumley, et al. (U.S. Pat. No. 4,429,301), and Strandt (U.S. Pat. No. 4,015,254).

Niki (U.S. Pat. No. 3,873,978) provides pairs of switching circuits responsive to the closure of a switch and that are biased to different voltage levels. Coupling rows and columns causes these circuits to change output logic levels and thereby supply signals characteristic of the particular row and column so coupled.

Osbome (U.S. Pat. No. 3,573,807), focuses on the generation of a different binary number when a switch in an array of switches is closed. He uses sets of transformers with different numbers of windings on the primary side to generate the numbers directly from the coupling of each switch closure.

Wilson (U.S. Pat. No. 4,303,907) describes the use of combinations of sourcing and sinking circuits and Field Effect Transistors (FETs) to design a matrix of switches. The FETs establish current mirrors, one mirror having a high impedance load; the other, a low load. Freeman (U.S. Pat. No. 4,906,993) has keys that have high impedance states plus input and output states to allow the number of switches to exceed the number of I/O lines.

No keypad currently available, however, seems to offer the combination of simplicity, low cost, simple connection to the host, freedom from active components, high electrical noise immunity, and potentially large numbers of keys.

SUMMARY OF THE INVENTION

According to its major aspects and broadly stated, the present invention is a matrix of conductors and switches that forms a keypad for data input, the switches shorting a row and a column conductor together when closed. The keypad has unidirectional, current regulating devices such as steering diodes and current-limiting devices in the form of current loops that create asymmetric current polarities when any switch is closed. These loops are driven by an AC (rather than a DC) signal, and preferably a square wave signal. Current flows whenever a key is pressed, with alternating polarities but unique positive and negative peak values for each combination of row and column conductor, hence, for every unique switch closed. Circuitry at the host determines these values and treats them as row and column coordinates to identify the key that was pressed. The keypad is thus kept rugged, simple, potentially inexpensive, free from active electronic components, and able to transmit signals from a large number of different input keys over a simple, low-cost and noise-immune, two-wire current loop.

A feature of the present invention is the use of current-regulating devices that allow current to pass without limit in one direction but limited in the other direction. The feature allows different currents to pass over each conductor when only one voltage is applied to the ends of the conductors so that each conductor can be distinguished.

Another feature of the present invention is the use of alternating current. Alternating current by its nature applies a range of voltages to the conductors, and in particular a range that has both positive and negative values. The use of a square wave as a preferred alternating current applies two distinct currents, one positive and one negative. The use of a square wave and current-regulating devices enables a two-wire system to carry the information of a multi-key system easily.

Other features and advantages of the present invention will be apparent to those skilled in the art from a careful reading of the Detailed Description of a Preferred Embodiment presented below and accompanied by the drawings.

BRIEF DESCRIPTION OF THE DRAWINGS

In the drawings,

FIGS. 1a, 1b, and 1c are circuit diagrams of three alternative embodiments of unidirectional current-regulating devices according to a preferred embodiment of the present invention;

FIG. 2 is a circuit diagram of a keypad according to the present invention, incorporating the unidirectional current regulating device of FIG. 1a;

FIG. 3 is a block diagram of an input device according to a preferred embodiment of the present invention;

DETAILED DESCRIPTION OF A PREFERRED EMBODIMENT

Figure 4:
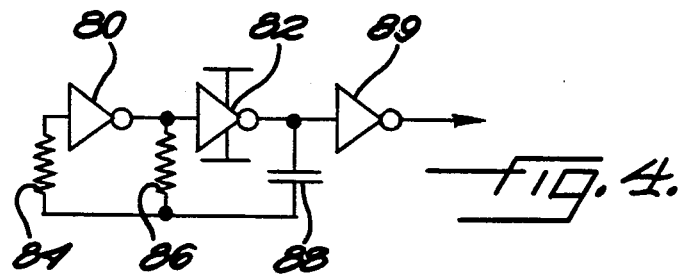
FIG. 4 is a circuit diagram of a square-wave generator for use with the present invention as shown in FIG. 3.

As exemplified in FIGS. 1a, 1b, and 1c, an important component of the present invention is a unidirectional current-regulating device: one which limits current to a fixed value in one direction, but passes current without limiting it in the other direction. If the applied voltage is well-regulated, this component may be as simple as the combination of resistor 10 and diode 12 shown in FIG. 1a. Alternatively, it may be the combination of resistors 14 and 16 with zener diode 18, transistor 20 and diode 22 of FIG. 1b, or a simple bipolar FET 24 with a resistor 26 and diode 28 to regulate current as shown in FIG. 1c. In each example, only current passing "upward" (according to the orientation of FIGS. 1a, 1b, and 1c) through the components as shown is regulated; "downward" current passes through diodes 12, 22, and 28, without regulation.

The FET regulator shown in FIG. 1c is available as a prepackaged commercial unit, in a range of nominal current ratings from 0.22 to 4.7 milliamperes, from the Siliconix "CR" series of "current regulating diodes". Diode 28 is inherent in the construction of the Siliconix device, and does not need to be added externally.

To form a keypad 30, according to the present preferred embodiment, a plurality of unidirectional current regulating devices 32, 34, 36, 38, 40, and 42 (arbitrarily selected as the type illustrated in FIG. 1a) and including diodes 44, 46 are connected in series with the rows and columns of a matrix keypad (FIG. 2). Keypad 30 comprises switches A through 0, rows 50, 52, 54 and 56, and columns 60, 62, 64, and 66. Connection is made so that row current-regulating devices limit current in a direction opposite that of column devices. Diodes 44, 46 are used alone in row 56 and column 66, respectively, and function as current-regulating devices set at zero current. The opposite ends of all row limiters are tied to a first conductor of the current loop; the opposite ends of all column limiters, to a second conductor of the same current loop.

Applying voltage to a keypad of this design, between the "+" and "−" terminals, and pressing any key A through 0, causes current to flow, as row and column conductors are shorted together. The key is pressed normally for a short time to close a switch briefly before release of the key opens the switch again. This current is determined by the current-regulating device, whether associated with the row or column, that has the proper polarity to limit current, and the device from the corresponding column or row, respectively, having the opposite polarity is bypassed by its associated diode. For a simple keypad of four rows and four columns, as shown in FIG. 2, up to fifteen keys may be distinguished:

| KEY  | FORWARD | REVERSE |
|------|---------|---------|
| A    | i4      | i1      |
| B    | i4      | i2      |
| C    | i4      | i3      |
| D    | i4      | 0       |
| E    | i5      | i1      |
| F    | i5      | i2      |
| G    | i5      | i3      |
| H    | i5      | 0       |
| I    | i6      | i1      |
| J    | i6      | i2      |
| K    | i6      | i3      |
| L    | i6      | 0       |
| M    | 0       | i1      |
| N    | 0       | i2      |
| O    | 0       | i3      |
| NONE | 0       | 0       |

For any arbitrarily-sized matrix of M rows and N columns (M and N taking value between one and approximately ten), the maximum number of distinguishable keys will be $(M \times N) - 1$, since one combination—that of zero forward and zero reverse current—will represent "no keys pressed". This assumes that one row and one column have simple diodes, as in keypad 30. If all rows or all columns (or both) have nonzero regulators, there will be no "zero/zero" row/column combination and the number of distinguishable keystrokes becomes $M \times N$. Optionally, a small current may be permitted on the line, in one direction or in both, even when no keys are pressed, to provide a continuous check of keypad and current loop integrity.

As illustrated schematically in FIG. 3, host-end circuitry 70 comprises two, nearly independent sections. The first of these sections is a source 72 of AC driving voltage for keypad 74; source 72 produces waveforms of virtually any type containing both positive and negative peaks, but is preferably a square-wave generator with roughly equal—and well-regulated—positive and negative output levels, operating at a frequency on the order of 10 kilohertz. A preferred driving circuit, shown in FIG. 4, is implemented using two or more CMOS inverters 80, 82, two resistors 84, 86 and a capacitor 88 and preferably an optional output buffer 89.

Figure 5:
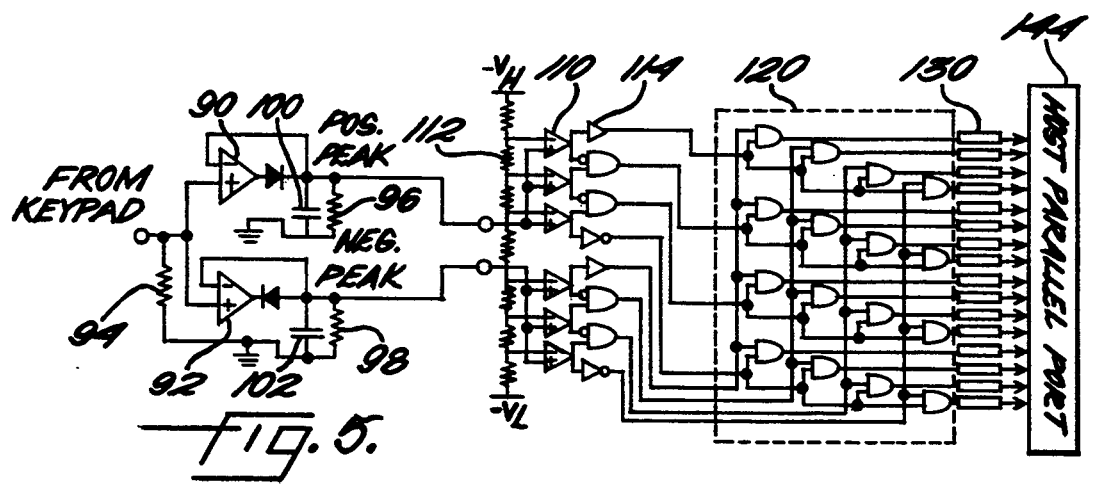
FIG. 5 is a circuit diagram of a preferred embodiment of the peak hold, window comparator and "AND" gate matrix plus delays according to the block diagram of FIG. 3.

Current from the driving circuit flows through the loop, including the keypad (FIG. 3) which may be remote from square wave source 72, and thence to the second part of the host circuitry. Here the positive and negative peak values of the current are measured, for example, by passing them through a fixed resistance 94 and measuring the peak values of the resulting voltages. As shown in FIG. 5, a preferred arrangement for measuring peak current values involves the use of two operational amplifiers 90, 92 connected as peak detectors of opposite polarities.

Decay-time constants in the peak detectors 90, 92, as established by resistor/capacitor combinations 96, 100 and 98, 102, respectively, are preferably equal to several cycles of the driving waveform but still short in comparison with key closure. The use of mechanical hysteresis in the keyswitches—provided, for instance, by using elastic metal "snap disks" beneath the keys, as is common in pocket calculators—provides adequate switch closure time for most applications. With the circuit shown in FIG. 5 and values of 10 K-ohms for resistor 94 and 100 K-ohms for resistors 96, 98 and 0.01 microfarad for capacitors 100, 102, the decay time is about one millisecond: ten times the square-wave period, and one-tenth of the shortest expected valid key closure.

Positive and negative peak values are sent to a set 110 of voltage comparators, having multiple digital outputs corresponding to different input voltage ranges. The limits of these ranges are selected from a voltage divider 112 composed of resistors so that the peak voltage resulting from current flow through a specific limiting device falls near the center of a corresponding voltage range; each range is thus unique to a single such device, and each combination of outputs from the positive and negative arrays is thus unique to a specific key in the matrix. The output of comparators 110 is fed into a series 114 of inverters and AND gates that determine which of the four peak row (M) currents and which of the four peak column (N) currents was passed because of a key closure.

The comparator outputs are sent to an array 120 of logic gates, preferably AND gates, as shown in FIG. 5, that produce a unique output for each combination of peak voltages; each output thus corresponds to one keypad key. Logic of this sort could be implemented conveniently in a programmable logic array.

Figure 6:
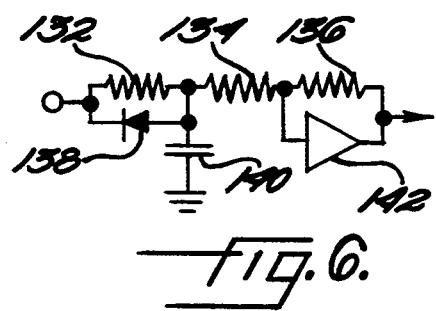
FIG. 6 is a circuit diagram of a delay circuit preferred for use with the present invention as shown in FIG. 5.

Key bounce and spurious triggering (as, for example, when rising or decaying peak voltages pass briefly through voltage ranges corresponding to keys not pressed) are eliminated by introducing a combination 130 of built-in circuit delays and hysteresis. There are many conventional ways of doing this, however, an illustration of one preferred way is shown in FIG. 6. The circuit diagram shown in FIG. 6 shows a series of resistors 132, 134, 136, with resistor 132 in parallel with diode 138 and isolated from ground by capacitor 140, and resistor 136 in parallel with an inverter 142. If resistors 132, 134, and 136 have values of 100 K-ohm, 470 K-ohm, and 2.2 M-ohm, respectively, and capacitor 140 has a value of 0.1 microfarad, the delay circuit of FIG. 6 will produce a delay logarithmically midway between the frequency of the alternating current and the shortest typical key contact duration.

After delay and hysteresis processing, the digital signals representing keystrokes are sent to a host 144: either as individual bits sent to a parallel I/O port, as shown, or in some other form after further processing, if required by the particular host.

It will be apparent to those skilled in the art that many changes and substitutions can be made to the preferred embodiment herein described without departing from the spirit and scope of the present invention as defined by the appended claims.

What is claimed is:

1. A data entry apparatus for use with a source of alternating current, said alternating current alternating direction of flow periodically, said source having a first terminal and a second terminal, said apparatus comprising:
   a first set of electrical conductors connected to said first terminal;
   a second set of electrical conductors connected to said second terminal;
   a plurality of switches, each switch of said plurality of switches having an open position and a closed position, said closed position connecting one conductor of said first set of electrical conductors to one conductor of said second set of electrical conductors;
   means in electrical connection with each conductor of said first and said second set of electrical conductors for regulating electrical current among said conductors so that when said each switch of said plurality of switches is closed thereby connecting said one conductor from said first set of conductors with said one conductor from said second set of conductors and current from said source of alternating current flows through said each closed switch, current passing through said each switch is limited in amount to a pair of values unique to said switch, one value of said pair of values for each direction of flow of said alternating current through said switch from said one conductors of said first and second sets of conductors; and
   means for decoding said pair of values of current so that said switch can be identified.

2. The apparatus as recited in claim 1, wherein said means for regulating further comprises a plurality of parallel combinations of (1) a resistor and (2) a diode, one each of said combinations placed in series between said first terminal of said source and each conductor of said first set of conductors and in series between said second terminal of said source and each conductor of said second set of conductors, said diodes oriented to pass current toward said plurality of switches.

3. The apparatus as recited in claim 1, wherein said means for regulating further comprises a plurality of parallel combinations of (1) a zener diode in series with a resistor, (2) a resistor in series with a transistor, and (3) a diode, one each of said combinations placed in series between said first terminal of said source and each conductor of said first set of conductors and in series between said second terminal of said source and each conductor of said second set of conductors, said diodes oriented to pass current toward said plurality of switches.

4. The apparatus as recited in claim 1, wherein said means for regulating further comprises a plurality of parallel combinations of (1) a resistor and a field effect transistor and (2) a diode, one each of said combinations placed in series between said first terminal of said source and each conductor of said first set of conductors and in series between said second terminal of said source and each conductor of said second set of conductors, said diodes oriented to pass current toward said plurality of switches.

5. The apparatus as recited in claim 1, wherein said decoding means further comprises:

means for generating a voltage proportional to each value of current, said unique pair of currents thereby generating a unique pair of voltages; and means in electrical connection with said generating means for producing a unique output for each unique pair of voltages.

6. A data entry apparatus, comprising:

a source of alternating current, said alternating current alternating direction of flow periodically, said source having a first terminal and a second terminal;

a first set of electrical conductors connected to said first terminal;

a second set of electrical conductors connected to said second terminal;

a plurality of switches, each switch of said plurality of switches having an open position and a closed position, said closed position connecting one conductor of said first set of electrical conductors to one conductor of said second set of electrical conductors;

means in electrical connection with each conductor of said first and said second set of electrical conductors for regulating electrical current among said conductors so that when said each switch of said plurality of switches is closed thereby connecting said one conductor from said first set of conductors with said one conductor from said second set of conductors and current from said source of alternating current flows through said each closed switch, current passing through said each switch is limited in amount to a pair of values unique to said switch, one value of said pair of values for each direction of flow of said alternating current through said switch from said one conductors of said first and second sets of conductors; and means for decoding said pair of values of current so that said switch can be identified.

7. The apparatus as recited in claim 6, wherein said means for regulating further comprises a plurality of parallel combinations of (1) a resistor and (2) a diode, one each of said combinations placed in series between said first terminal of said source and each conductor of said first set of conductors and in series between said second terminal of said source and each conductor of said second set of conductors, said diodes oriented to pass current toward said plurality of switches.

8. The apparatus as recited in claim 6, wherein said means for regulating further comprises a plurality of parallel combinations of (1) a zener diode in series with a resistor, (2) a resistor in series with a transistor, and (3) a diode, one each of said combinations placed in series between said first terminal of said source and each conductor of said first set of conductors and in series between said second terminal of said source and each conductor of said second set of conductors, said diodes oriented to pass current toward said plurality of switches.

9. The apparatus as recited in claim 6, wherein said means for regulating further comprises a plurality of parallel combinations of (1) a resistor and a field effect transistor and (2) a diode, one each of said combinations placed in series between said first terminal of said source and each conductor of said first set of conductors and in series between said second terminal of said source and each conductor of said second set of conductors, said diodes oriented to pass current toward said plurality of switches.

10. The apparatus as recited in claim 6, wherein said decoding means further comprises:

means for generating a voltage proportional to each value of current, said unique pair of currents thereby generating a unique pair of voltages; and means in electrical connection with said generating means for producing a unique output for each unique pair of voltages.

11. The apparatus as recited in claim 6, wherein said source generates current in the form of a square wave, alternating from a positive value of current to a negative value.

* * * * *